（12） United States Patent
Hsu et al.

(10) Patent No.: US 10,573,536 B2
(45) Date of Patent: *Feb. 25, 2020

(54) SEMICONDUCTOR PACKAGE AND METHOD FOR FABRICATING BASE FOR SEMICONDUCTOR PACKAGE

(71) Applicant: MediaTek Inc., Hsin-Chu (TW)

(72) Inventors: Wen-Sung Hsu, Zhubei (TW); Ta-Jen Yu, Taichung (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/264,250

(22) Filed: Jan. 31, 2019

(65) Prior Publication Data

US 2019/0164780 A1 May 30, 2019

Related U.S. Application Data

(63) Continuation of application No. 15/893,527, filed on Feb. 9, 2018, now Pat. No. 10,236,187, which is a
(Continued)

(51) Int. Cl.
*H01L 23/64* (2006.01)
*H01L 23/538* (2006.01)
(Continued)

(52) U.S. Cl.
CPC .......... *H01L 21/485* (2013.01); *H01F 17/00* (2013.01); *H01L 21/486* (2013.01); *H01L 23/49827* (2013.01); *H01L 23/5389* (2013.01); *H01L 23/642* (2013.01); *H01L 23/645* (2013.01); *H01L 23/66* (2013.01); *H01L 24/17* (2013.01); *H01L 25/50* (2013.01); *H05K 1/181* (2013.01); *H05K 1/183* (2013.01); *H05K 3/0017* (2013.01); *H05K 3/0026* (2013.01); *H05K 3/0047* (2013.01); *H05K 3/107* (2013.01); *H05K 3/188* (2013.01); *H05K 3/303* (2013.01); *H01F 17/0006* (2013.01); *H01L 21/568* (2013.01); *H01L 21/6835* (2013.01); *H01L 21/705* (2013.01); *H01L 23/49822* (2013.01); *H01L 2224/13147* (2013.01); *H01L 2224/16113* (2013.01); *H01L 2224/16225* (2013.01); *H01L 2224/16237* (2013.01); *H01L 2924/1206* (2013.01); *H01L 2924/12042* (2013.01); *H01L 2924/1421* (2013.01);
(Continued)

(58) Field of Classification Search
CPC ............. H01L 23/5388; H01L 23/5389; H01L 23/642; H01L 23/66
USPC ................................ 257/679, 723–725, 728
See application file for complete search history.

(56) References Cited

U.S. PATENT DOCUMENTS 7,642,128 B1 1/2010 Lin et al.
8,163,597 B2 4/2012 Huang et al.
(Continued)

FOREIGN PATENT DOCUMENTS

WO WO 2009127780 A1 10/2009

*Primary Examiner* — Matthew E Warren
(74) *Attorney, Agent, or Firm* — Wolf, Greenfield & Sacks, P.C.

(57) ABSTRACT

The invention provides a semiconductor package and a method for fabricating a base for a semiconductor package. The semiconductor package includes a base. The base has a device-attach surface. A radio-frequency (RF) device is embedded in the base. The RF device is close to the device-attach surface.

20 Claims, 6 Drawing Sheets

Related U.S. Application Data continuation of application No. 14/205,836, filed on Mar. 12, 2014, now Pat. No. 9,922,844.

(51) Int. Cl.

| | | |
|---|---|---|
| H01L 23/66 | (2006.01) | |
| H01L 21/48 | (2006.01) | |
| H01L 25/00 | (2006.01) | |
| H01L 23/498 | (2006.01) | |
| H01L 23/00 | (2006.01) | |
| H05K 1/18 | (2006.01) | |
| H05K 3/00 | (2006.01) | |
| H05K 3/10 | (2006.01) | |
| H05K 3/18 | (2006.01) | |
| H05K 3/30 | (2006.01) | |
| H01F 17/00 | (2006.01) | |
| H01L 21/683 | (2006.01) | |
| H01L 21/70 | (2006.01) | |
| H01L 21/56 | (2006.01) | |
| H05K 1/16 | (2006.01) | |

(52) U.S. Cl.
CPC ........ *H01L 2924/1517* (2013.01); *H01L 2924/15165* (2013.01); *H01L 2924/2064* (2013.01); *H05K 1/165* (2013.01); *H05K 2201/10098* (2013.01)

(56) References Cited

U.S. PATENT DOCUMENTS

| | | | |
|---|---|---|---|
| 9,922,844 B2 * | 3/2018 | Hsu | H01L 21/485 |
| 10,115,604 B2 | 10/2018 | Hsu et al. | |
| 10,236,187 B2 * | 3/2019 | Hsu | H01L 21/485 |
| 2007/0090911 A1 * | 4/2007 | Lee | H01F 17/0006 336/200 |
| 2007/0164414 A1 * | 7/2007 | Dokai | G06K 19/07749 257/679 |
| 2008/0246664 A1 * | 10/2008 | Ikemoto | G06K 19/07749 343/700 MS |
| 2010/0006994 A1 | 1/2010 | Shim et al. | |
| 2011/0050334 A1 | 3/2011 | Pan et al. | |
| 2014/0020940 A1 | 1/2014 | Mano et al. | |
| 2015/0262840 A1 | 9/2015 | Hsu et al. | |
| 2015/0264814 A1 | 9/2015 | Hsu et al. | |
| 2018/0166297 A1 | 6/2018 | Hsu et al. | |

* cited by examiner

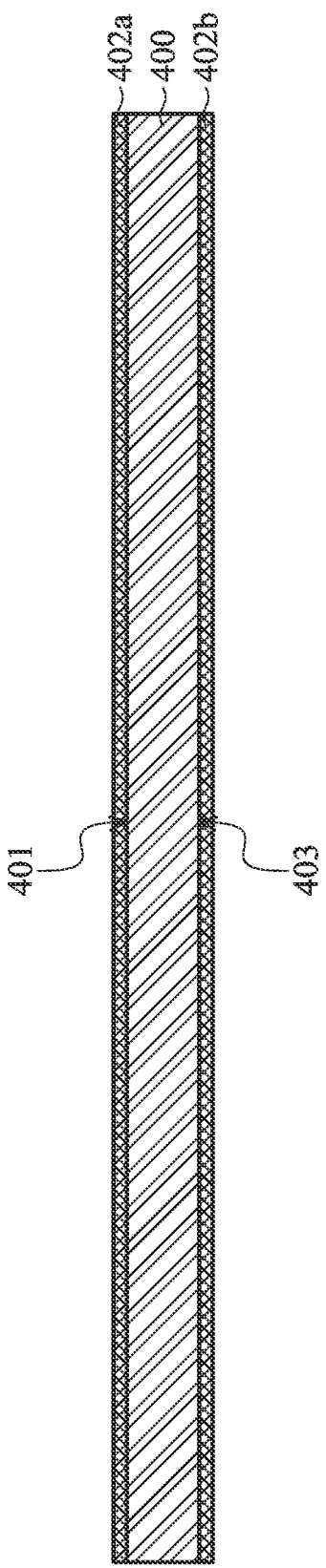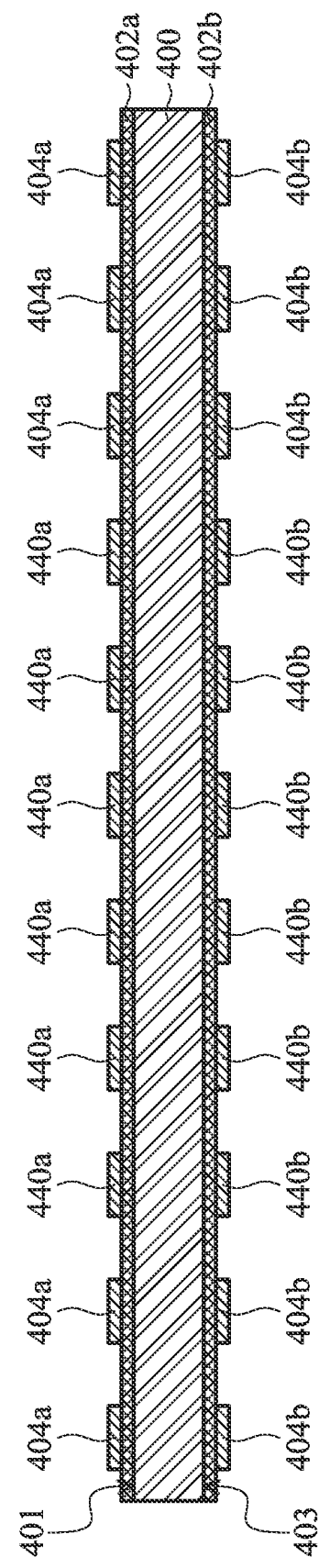

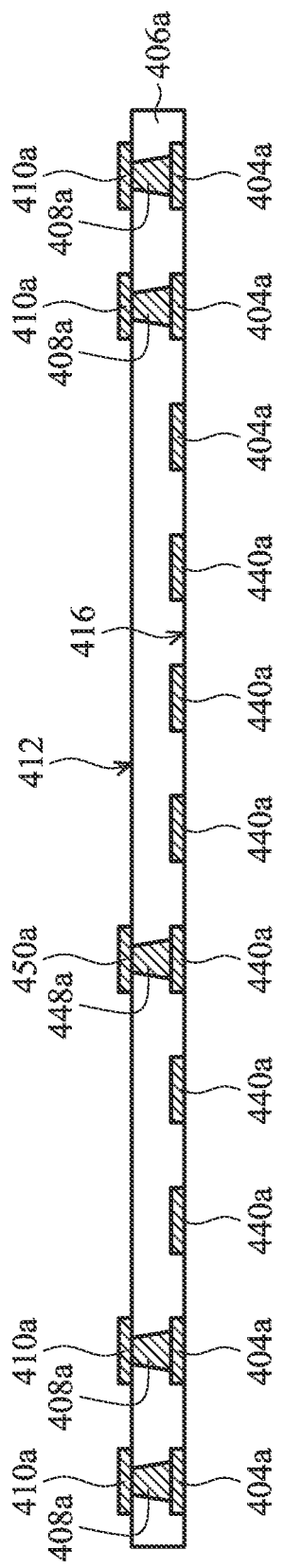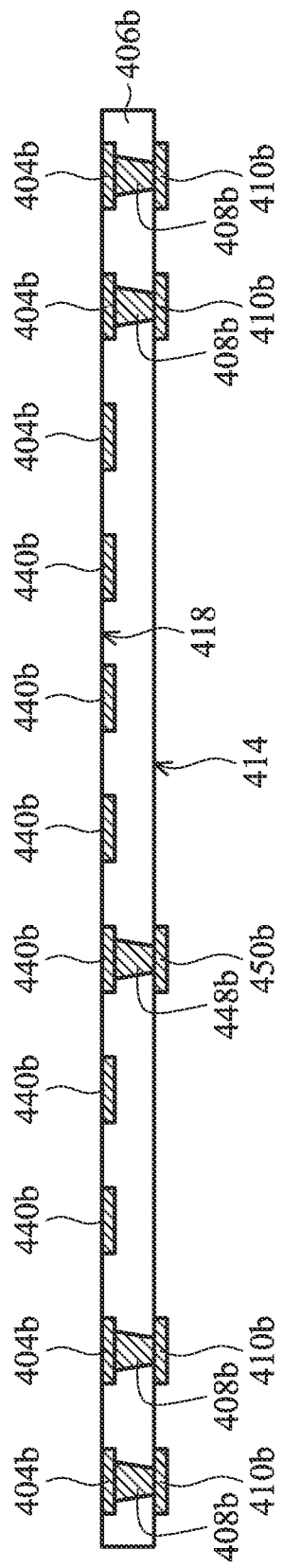

//<br>

SEMICONDUCTOR PACKAGE AND METHOD FOR FABRICATING BASE FOR SEMICONDUCTOR PACKAGE

CROSS REFERENCE TO RELATED APPLICATIONS

This Application is a continuation of U.S. application Ser. No. 15/893,527 filed Feb. 9, 2018, entitled "SEMICONDUCTOR PACKAGE AND METHOD FOR FABRICATING BASE FOR SEMICONDUCTOR PACKAGE," the entire contents of which is incorporated herein by reference. U.S. application Ser. No. 15/893,527 is a continuation of U.S. application Ser. No. 14/205,836, filed Mar. 12, 2014, entitled "SEMICONDUCTOR PACKAGE AND METHOD FOR FABRICATING BASE FOR SEMICONDUCTOR PACKAGE," the entire contents of which is incorporated herein by reference.

BACKGROUND OF THE INVENTION

Field of the Invention

The present invention relates to a semiconductor package and a method for fabricating a base for a semiconductor package, and in particular, to a base with a radio-frequency (RF) device embedded therein for a semiconductor package.

Description of the Related Art

In high-speed applications (e.g. radio-frequency (RF) applications), the conventional RF device comprises several discrete RF chips and other active or passive devices (such as inductors, antennas, filters, power amplifiers (PAs), decoupling or matching circuits) mounted on an RF main die. However, the on-wafer inductors of the conventional RF device are formed of aluminum (Al), and the thickness of the on-wafer inductors is limited by the fabrication processes of the conventional RF device. Therefore, inductors of the conventional RF device, also referred to as on-wafer inductors, suffer from large area consumption and a low quality factor (Q-factor). Also, the size of the RF main die and the number of die-per-wafer of the conventional RF device cannot be reduced.

Thus, a novel RF device package is desirable.

BRIEF SUMMARY OF INVENTION

A semiconductor package and a method for fabricating a base for a semiconductor package are provided. An exemplary embodiment of a semiconductor package includes a base having a device-attach surface. A radio-frequency (RF) device is embedded in the base, close to the device-attach surface.

Another exemplary embodiment of a semiconductor package includes a radio-frequency (RF) device, having a bottom surface and a sidewall connected to a base. A semiconductor device is mounted on the RF device via a conductive structure.

An exemplary embodiment of a method for fabricating a base for a semiconductor package includes providing a carrier with conductive seed layers on the top surface and the bottom surface of the carrier. Radio-frequency (RF) devices are respectively formed on the conductive seed layers. A first base material layer and a second base material layer are respectively laminated on the conductive seed layers, covering the RF devices. The first base material layer and the second base material layer, which contain the RF devices thereon, are separated from the carrier to form a first base and a second base.

Another exemplary embodiment of a method for fabricating a semiconductor package includes providing a base. At least one radio-frequency (RF) device is formed on the base. An additional insulation material is formed on the base, and further defining patterns upon the additional insulation material, wherein the pattern is formed on the RF device(s).

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 4A to 4E are cross sections showing one exemplary embodiment of a method for fabricating a base with an RF device for a semiconductor package of the invention.

DETAILED DESCRIPTION OF INVENTION

Figure 1:
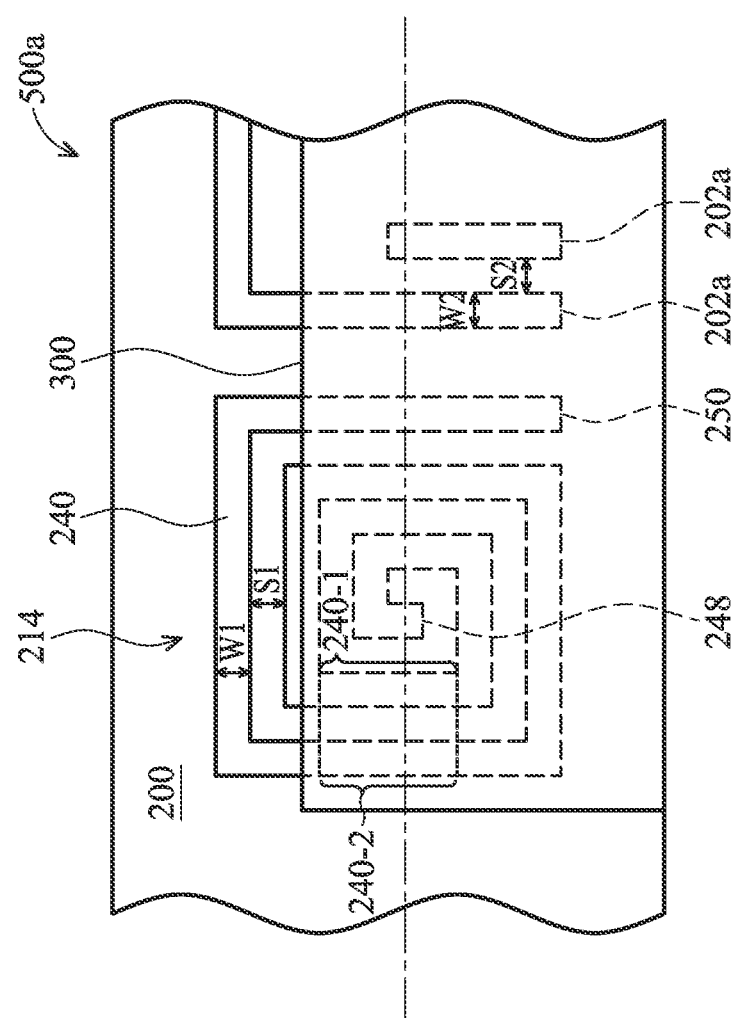
FIG. 1 is a top view showing one exemplary embodiment of a semiconductor package, especially showing a base with a radio-frequency (RF) device embedded therein for a semiconductor package.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2:
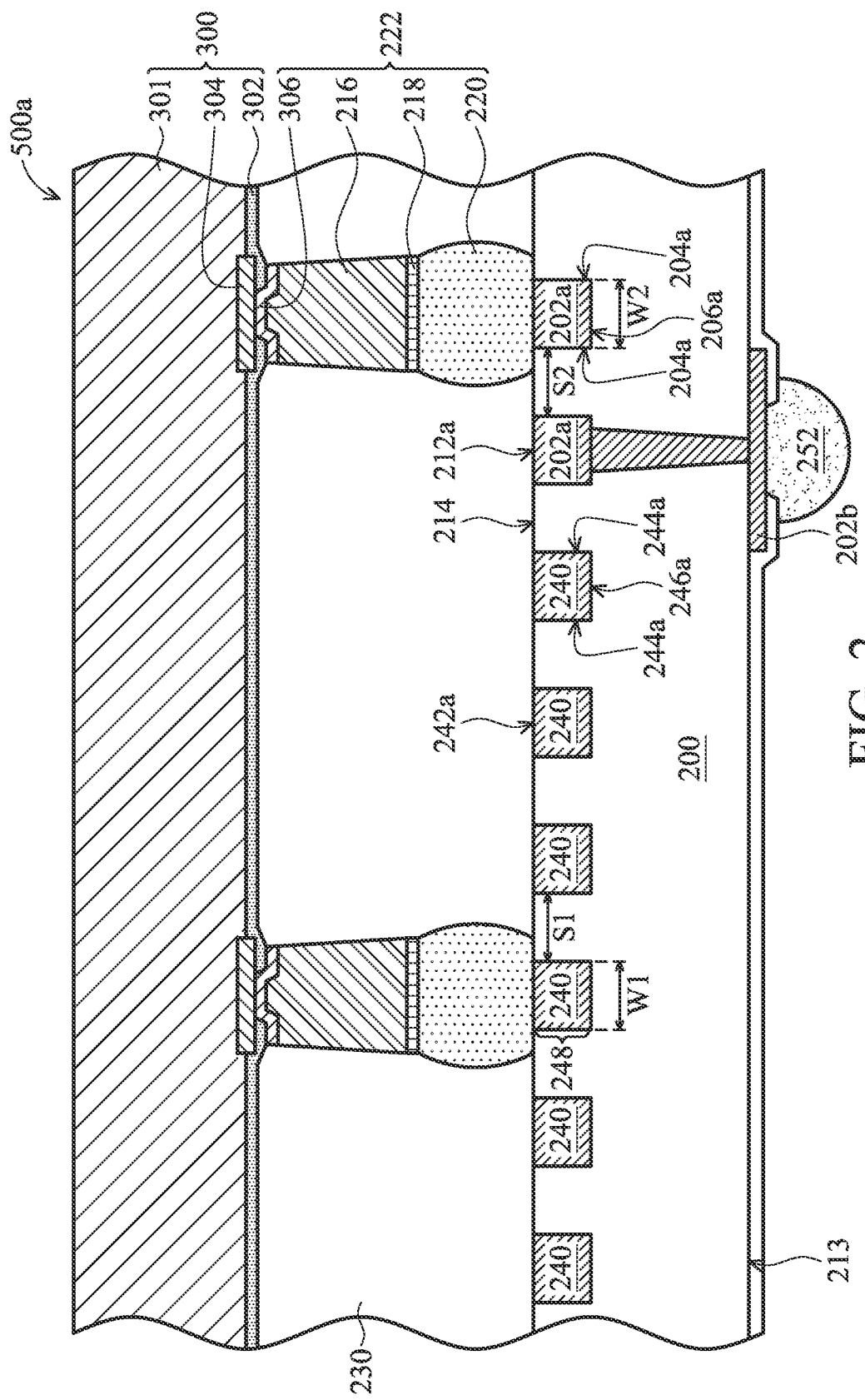
FIG. 2 is a partial cross section taken along a line A-A' of FIG. 1, showing one exemplary embodiment of a semiconductor package, especially showing a base with a radio-frequency (RF) device embedded therein for a semiconductor package.

FIG. 1 is a top view showing one exemplary embodiment of a semiconductor package 500a, especially showing a base with a radio-frequency (RF) device embedded therein for a semiconductor package. In this embodiment, the semiconductor package can be a flip chip package using conductive structures, for example, copper pillar bumps, connecting a semiconductor device to a base. Alternatively, the semiconductor package can be a package using wire bonding technology to connect a semiconductor device to a base. FIG. 2 shows a partial cross section taken along a line A-A' of FIG. 1, showing one exemplary embodiment of a semiconductor package 500a of the invention. Please refer to FIGS. 1 and 2, wherein the semiconductor package 500a comprises a base 200 having a device-attach surface 214 and a solder-ball-attach surface 213 opposite to the device-attach surface 214. In one embodiment, the base 200, for example, a printed circuit board (PCB), may be formed of polypropylene (PP). It should also be noted that the base 200 can be a single layer or a multilayer structure. In this embodiment, a radio-frequency (RF) device 240 is formed embedded in the base 200, close to the device-attach surface 214. In one embodiment, the RF device 240 may comprise an inductor, antenna, filter, power amplifiers (PAs), decoupling or matching circuits. In this embodiment, the RF device 240 is an inductor 240. In this embodiment, the RF device 240 has two terminal portions 248 and 250 serving as pad regions 248 and 250 to connect to a semiconductor device 300 mounted directly onto the base 200. In this embodiment, the RF device 240 has a plurality of device portions, for example, device portions 240-1 and 240-2. The device portions 240-1 and 240-2 of the RF device 240 may be designed to have a width W1 which is larger than 5 μm, and a minimum spacing S1 which is about 10-12 μm. However, it should be noted that there is no limitation on the width W1 and the minimum spacing S1 of the device portions 240-1 and 240-2 of the RF device 240.

Alternatively, a plurality of first conductive traces 202a may also be designed to be embedded in the base 200, close to the device-attach surface 214. In one embodiment, the first conductive traces 202a may comprise signal trace segments or ground trace segments, which are used for input/output (I/O) connections of the semiconductor device 300 mounted directly onto the base 200. Therefore, each of the first conductive traces 202a has a portion serving as a pad region of the base 200. In this embodiment, the first conductive traces 202a are designed to have a width W2 which is larger than 5 μm, and a minimum spacing S2 which is about 10-12 μm. However, it should be noted that there is no limitation on the width of the conductive traces. For different designs, the width of the conductive traces can be smaller than 5 μm if required.

In one embodiment as shown in FIG. 2, a second conductive trace 202b may also be designed to be disposed on the solder-ball-attach surface 213 of the base 200. In this embodiment, a solder-ball structure 252 may also be designed to be disposed on the second conductive trace 202b.

A semiconductor device 300 is mounted on the device-attach surface 214 of the base 200 with an active surface of the semiconductor device 300 facing the base 200 by a bonding process. In one embodiment, the semiconductor device 300 may comprise a die, a package, or a wafer-level package. In this embodiment, the semiconductor device 300 is a flip chip package. As shown in FIG. 2, the semiconductor device 300 may include a body 301, metal pads 304 overlying the semiconductor body 301, and an insulation layer 302 covering the metal pads 304. The circuitry of the semiconductor device 300 is disposed on the active surface, and the metal pads 304 are disposed on the top of the circuitry. The circuitry of the semiconductor device 300 is interconnected to the RF device 240 and the first conductive traces 202a embedded in the base 200 via a plurality of conductive structures 222 disposed on the active surface of the semiconductor device 300. However, it should be noted that the conductive structures 222 shown in FIG. 2 are only an example and is not a limitation to the present invention.

As shown in FIG. 2, the conductive structure 222 may comprise a conductive bump structure such as a copper bump or a solder bump structure, a conductive wire structure, or a conductive paste structure. In this embodiment, the conductive structure 222 may be a copper bump structure composed of a metal stack comprising a UBM (under-bump metallurgy) layer 306, a copper layer 216 such as a plated copper layer, a conductive buffer layer 218, and a solder cap 220. In one embodiment, the UBM layer 306 can be formed on the exposed metal pads 304 within the openings by a deposition method such as a sputtering or plating method and a subsequent anisotropic etching process. The anisotropic etching process is performed after forming conductive pillars. The UBM layer 306 may also extend onto a top surface of the insulation layer 302. In this embodiment, the UBM layer 306 may comprise titanium, copper, or a combination thereof. A copper layer 216 such as an electroplated copper layer can be formed on the UBM layer 306. The opening can be filled with the copper layer 216 and the UBM layer 306, and the copper layer 216 and the UBM layer 306 within the opening may form an integral plug of the conductive structure 222. The formation position of the copper layer 216 is defined by a dry film photoresist or liquid photoresist patterns (not shown).

In one embodiment, an underfill material or the underfill 230 can be introduced into the gap between the semiconductor device 300 and the base 200. In one embodiment, the underfill 230 may comprise a capillary underfill (CUF), molded underfill (MUF), or a combination thereof.

In one embodiment, the RF device 240 and the first conductive traces 202a may have a top surface disposed above, below, or aligned to a surface of the base to improve routing ability for high-density semiconductor packages. As shown in FIG. 2, the RF device 240 has a top surface 242a disposed aligned to the device-attach surface 214 of the base 200. That is to say, the bottom surface 246a and at least a sidewall 244a of the RF device 240 are designed to be fully connected to the base 200. Alternatively, the first conductive traces 202a may have a similar arrangement to the RF device 240. For example, the first conductive traces 202a have top surfaces 212a disposed aligned to the device-attach surface 214 of the base 200. Also, the bottom surface 206a and a sidewall 204a of the conductive trace 202a are designed to be fully connected to the base 200. In this embodiment, the solder cap 220 of the conductive structure 222 is disposed to contact with a portion of the base 200 and to connect to a top surface 242a of the RF device 240 and a top surface 212a of the first conductive trace 202a. Due to the top surfaces of the RF device and the first conductive traces being coplanar to the device-attach surface 214 of the base 200, the bump-to-trace space is increased and the problem of bump-to-trace bridging can be effectively avoided.

Figure 3:
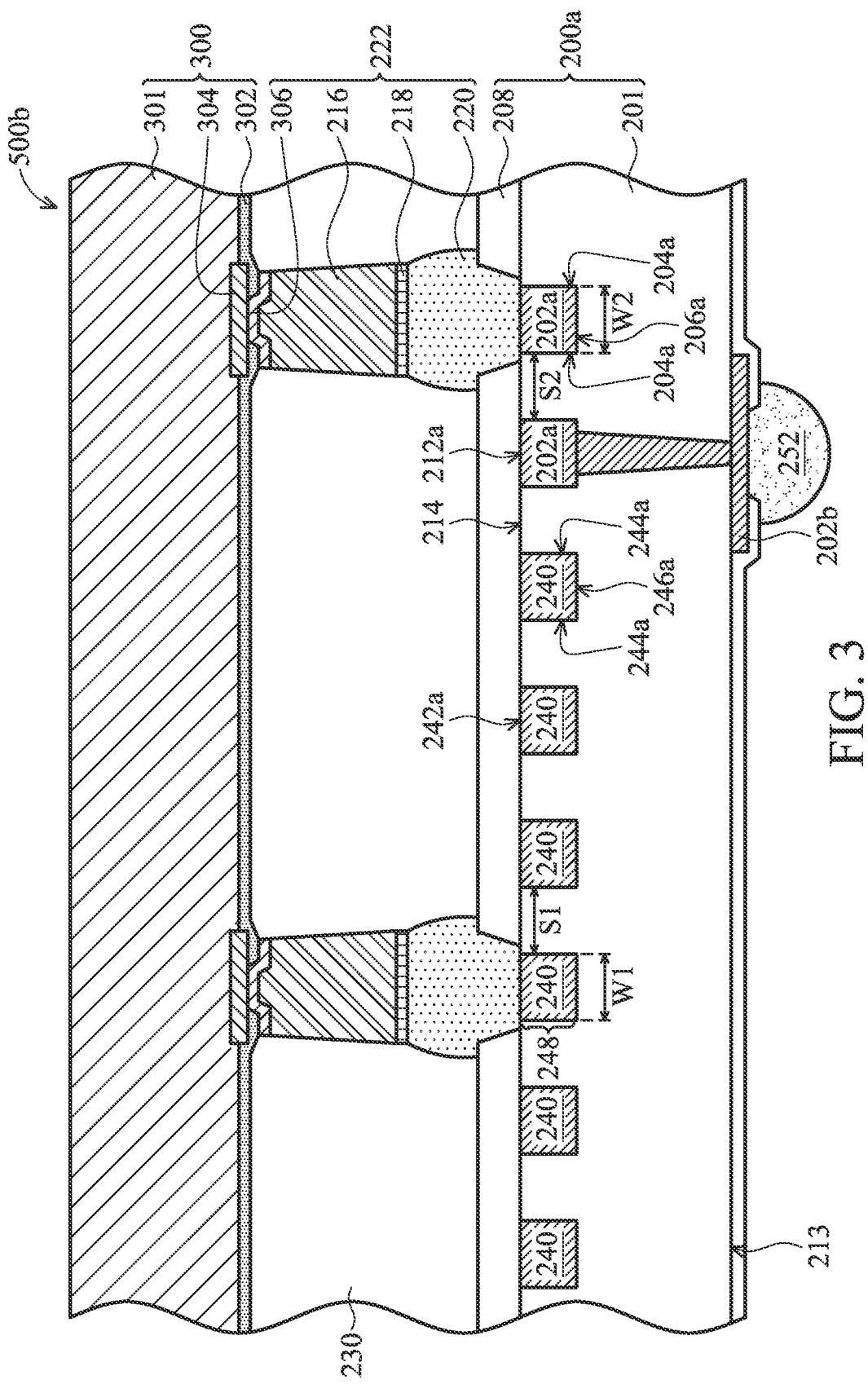
FIG. 3 shows a partial cross section taken showing another exemplary embodiment of a semiconductor package of the invention, especially showing a base with a radio-frequency (RF) device embedded therein for a semiconductor package.

FIG. 3 shows a partial cross section taken showing another exemplary embodiment of a semiconductor package 500b of the invention, especially showing a base 200a with a radio-frequency (RF) device embedded therein for a semiconductor package. Alternatively, the base 200a may comprise a multilayer structure. In this embodiment, the multilayered base 200a may have a base portion 201 allowing the RF device 240 to be embedded therein. Also, the multilayered base 200a further comprises an insulation layer 208 having openings therethrough disposed on the base portion 204 close to a device-attach surface 214 of the base portion 204. In this embodiment, the base portion 201 and the insulation layer 208 collectively serve as a multilayer base 200a. In this embodiment, the RF device 240 and the first conductive traces 202a embedded in the base portion 201. The top surface 242a of the RF device 240 and the top surface 202a of the first conductive traces 202a may be aligned to the device-attach surface 214 of the base portion

204. In this embodiment, the RF device 240 and the first conductive traces 202a embedded in the base portion 201 may be exposed within the openings of the insulation layer 208.

Figure 4C:
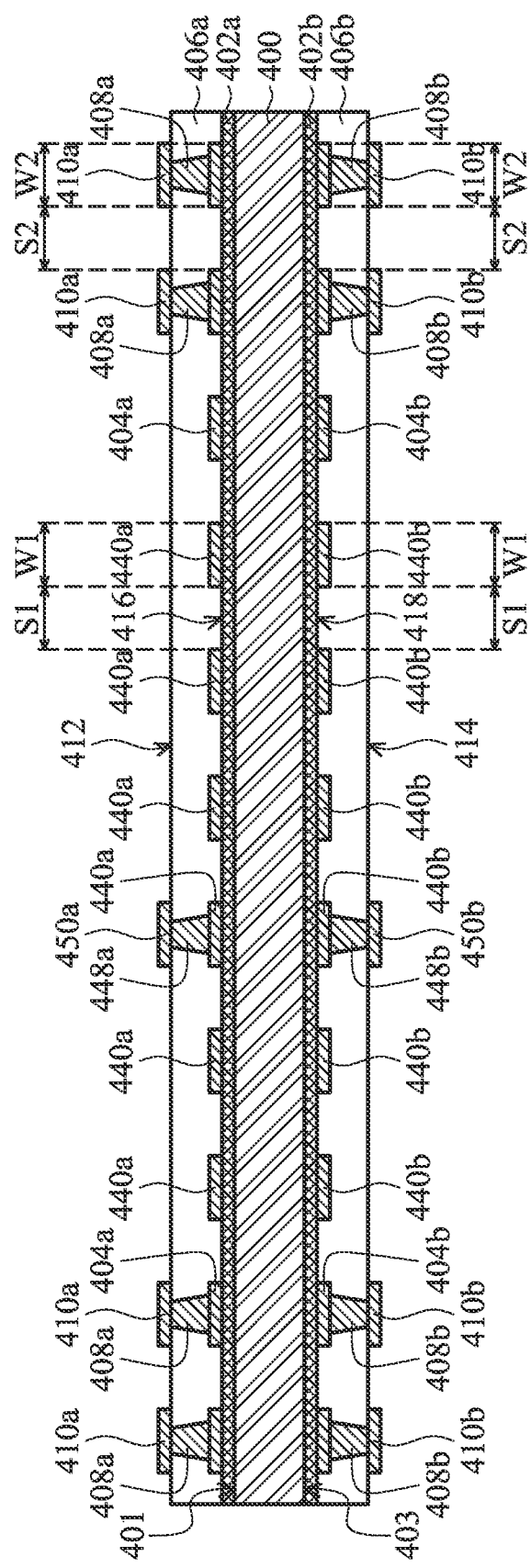

FIGS. 4A to 4E are cross sections showing one exemplary embodiment of a method for fabricating two bases 200c and 200d with the RF devices for a semiconductor package of the invention. In this embodiment, the method for fabricating bases for a semiconductor package is also called a double-sided base fabricating process. Elements of the embodiments that are the same or similar as those previously described with reference to FIGS. 1-3, are hereinafter not repeated for brevity. As shown in FIG. 4A, a carrier 400 with conductive seed layers 402a and 402b on the top surface 401 and the bottom surface 403 is provided. In one embodiment, the carrier 400 may comprise FR4 glass epoxy or stainless steel. Also, the conductive seed layers 402a and 402b are used as seed layers for subsequently formed interconnection conductive traces of bases on the top surface 401 and the bottom surface 403 of the carrier 400. In one embodiment, the conductive seed layers 402a and 402b may comprise copper.

Next, as shown in FIG. 4B, RF devices 440a, 440b and first conductive traces 404a, 404b are formed simultaneously on the top surface 401 and the bottom surface 403 of the carrier 400. Bottom portions of the RF devices 440a, 440b and the first conductive traces 404a and 404b connect to top portions of the conductive seed layers 402a and 402b. In one embodiment, the RF devices 440a, 440b and the first conductive traces 404a, 404b may be formed by a plating process and an anisotropic etching process. The plating process and the anisotropic etching process are performed simultaneously on the top surface 401 and the bottom surface 403 of the carrier 400. In one embodiment, the plating process may comprise an electrical plating process. In one embodiment, the RF devices 440a, 440b and the first conductive traces 404a, 404b may comprise copper (Cu). In one embodiment, the RF devices 440a, 440b may serve as inductors 440a, 440b. In one embodiment, the width W1 and the minimum spacing S1 of the RF devices 440a, 440b or the width W2 and the minimum spacing S2 of the first conductive traces 404a, 404b can be precisely controlled due to the formation processes, for example, the anisotropic etching process. In this embodiment, the RF devices 440a, 440b may be designed to have a width W1 which is larger than 5 μm, and a minimum spacing S1 which is about 10-12 μm. In this embodiment, the first conductive traces 404a, 404b may be designed to have a width W2 which is larger than 5 μm, and a minimum spacing S2 which is about 10-12 μm. However, it should be noted that there is no limitation on the widths W1, W2 and minimum spacing S1, S2 of the RF device and the first conductive traces. For different designs, the width S1 and S2 can be smaller than 5 μm if required. Therefore, turns of the resulted inductor 440a, 440b embedded in the base can be increased over that of the conventional on-wafer inductor. Also, the resulted inductor 440a, 440b has a dramatically increase in thickness compared to the conventional on-wafer inductor due to the formation processes, for example, the plating process. Further, the inductor 440a, 440b is formed of copper (Cu), and the resistance of the inductor can be reduced from that of the conventional on-wafer inductor formed of aluminum (Al).

Next, as shown in FIG. 4C, a laminating process is performed to dispose a first base material layer 406a and a second base material layer 406b on the top surface 401 and the bottom surface 403 of the carrier 400, respectively, wherein the first base material layer 406a and a second base material layer 406b cover the RF devices 440a, 440b and the first conductive traces 404a and 404b, respectively. In this embodiment, the laminating process of the first base material layer 406a and the second base material layer 406b is performed simultaneously on the on the top surface 401 and the bottom surface 403 of the carrier 400. In one embodiment, the first base material layer 406a and the second base material layer 406b may comprise polypropylene (PP).

Next, please refer to FIG. 4C again, wherein a drilling process is performed to form openings (not shown) through the first base material layer 406a and the second base material layer 406b to define the formation positions of subsequently formed vias 408a, 408b, 448a and 448b. In one embodiment, the drilling process may comprise a laser drilling process, an etching drilling process, or a mechanical drilling process. Next, a plating process is performed to fill a conductive material into the openings to form vias 448a and 448b for interconnecting the RF devices 440a, 440b to subsequent second conductive traces 450a and 450b. Also, the plating process is performed simultaneously to fill a conductive material into the openings to form vias 408a and 408b for interconnecting the first conductive traces 404a and 404b to subsequent second conductive traces 410a and 410b. In this embodiment, the drilling process and the plating process are performed simultaneously on the first base material layer 406a and the second base material layer 406b, respectively.

Next, please refer to FIG. 4C again, wherein a plurality of second conductive traces 410a, 410b, 450a and 450b are respectively formed on a first surface 412 of the first base material layer 406a and a first surface 414 of the second base material layer 406b. As shown in FIG. 4C, the first surface 412 of the first base material layer 406a and the first surface 414 of the second base material layer 406b are away from the top surface 401 and the bottom surface 403 of the carrier 400, respectively. The second conductive traces 410a, 410b, 450a and 450b are formed by a plating process and an anisotropic etching process. The plating process and the anisotropic etching process are performed simultaneously on the first surface 412 of the first base material layer 406a and the first surface 414 of the second base material layer 406b. In one embodiment, the plating process may comprise an electrical plating process. In one embodiment, the second conductive traces 410a, 410b, 450a and 450b may comprise copper. In one embodiment, the second conductive traces 410a, 410b, 450a and 450b are designed to have a width W2 which is larger than 5 μm, and a minimum spacing S2 which is about 10-12 μm. However, it should be noted that there is no limitation on the width of the conductive traces. For different designs, the width of the second conductive traces 410a, 410b, 450a and 450b can be smaller than 5 μm if required. In this embodiment, the anisotropic etching process may precisely control the width of the second conductive traces 410a, 410b, 450a and 450b.

Next, as shown in FIGS. 4D and 4E, the first base material layer 406a, which comprises the RF device 440a and the first conductive traces 404a embedded therein and second conductive traces 410a and 450a thereon, and the second base material layer 406b, which comprises the RF device 440b and the first conductive traces 404b embedded therein and the second conductive traces 410b and 450b thereon, are respectively separated from the top surface 401 and the bottom surface 403 of the carrier 400 to form a first base 200c and a second base 200d which are separated from each other. Next, as shown in FIGS. 4d and 4e again, the conductive seed layers 402a and 402b are removed from the first base 200c and the second base 200d, respectively.

As shown in FIGS. 4D and 4E, the RF device 440a, 440b and the first conductive traces 404a, 404b are aligned to second surfaces 416 and 418 of the of the first and second bases 200c and 200d, which are opposite to the first surfaces 412 and 414, respectively. In this embodiment, the first base 200c and the second base 200d are fabricated simultaneously on opposite surfaces (the top surface 401 and the bottom surface 403) by the double-sided base fabricating process.

Next, a bonding process is performed to mount a semiconductor device (e.g. the semiconductor device 300 as shown in FIG. 2) on the first base 200c/second base 200d after the separation process through the conductive structure (e.g. the conductive structure 222 as shown in FIG. 2). After the bonding process, the conductive structures are in contact with the top surface of the RF device 440a/440b and the first conductive traces 404a, 404b as shown in FIGS. 4D and 4E. Next, an underfill material or the underfill (e.g. the underfill 230 as shown in FIG. 2) can be introduced into the gap between the semiconductor device and the first base 200c/second base 200d. Finally, the first base 200c/second base 200d, the RF device 440a/440b, the conductive trace 404a/404b, the second conductive traces 410a/410b, 450a/450b as shown in FIGS. 4D and 4E, the semiconductor device (e.g. the semiconductor device 300 as shown in FIG. 2), and the conductive structure (e.g. the conductive structure 222 as shown in FIG. 2) may collectively form a semiconductor package (e.g. the semiconductor package 500a as shown in FIG. 2).

Alternatively, two passivation or insulation layers (e.g. the insulation layer 208 as shown in FIG. 3) having openings may optionally be formed on the second surface 416 of the first base 200c and the second surface 418 of the second base 200d, respectively, after the separation of the first base 200c and the second base 200d as shown in FIGS. 4D and 4E. In this embodiment, terminal portions of the RF device 440a, 440b, and the first conductive traces 404a and 404b of the first and second bases 200c and 200d are exposed within the opening. Also, in this embodiment, the first base 200c/second base 200d and the insulation layer thereon collectively serve as a multilayer base. After performing the bonding process and the underfill material/underfill introducing process, the first base 200c/second base 200d, the RF device 440a/440b, the conductive trace 404a/404b, the second conductive traces 410a/410b, 450a/450b as shown in FIGS. 4D and 4E, the semiconductor device (e.g. the semiconductor device 300 as shown in FIG. 2), and the conductive structure (e.g. the conductive structure 222 as shown in FIG. 2) may collectively form a semiconductor package (e.g. the semiconductor package 500b as shown in FIG. 3).

Exemplary embodiments provide a semiconductor package and a method for fabricating a base for a semiconductor package. The semiconductor package is designed to comprise RF devices, for example, inductors, embedded in a base such as a printed circuit board (PCB). The RF devices may have a top surface disposed above, below, or aligned to a surface of the base to improve routing ability for high-density semiconductor packages. Also, the RF devices are designed to have a width which is larger than 5 μm, and a minimum spacing which is about 10-12 μm. Further, the base may comprise a single layer structure or a multilayer structure. Exemplary embodiments also provide a method for fabricating a base for a semiconductor package. In one embodiment, the method can fabricate two bases on two sides of a carrier simultaneously with the RF devices, for example, inductors, embedded in the base. Further, the RF device may be formed by a plating process and an anisotropic etching process, and the anisotropic etching process may precisely control the width and minimum spacing of the RF device. Therefore, turns of the inductor embedded in the base can be increased over that of the conventional on-wafer inductor. Accordingly, the size of the semiconductor device (or die size) mounted on the base can be reduced, and the number of die-per-wafer can be increased. Also, one exemplary embodiment of the inductor embedded in the base has a dramatically increase in thickness compared to that of the conventional on-wafer inductor due to the formation processes, for example, the plating process. Further, one exemplary embodiment of the inductor embedded in a base is formed of copper (Cu), and the resistance of the inductor can be reduced from that of the conventional on-wafer inductor formed of aluminum (Al). Therefore, one exemplary embodiment of the inductor embedded in a base may have a higher quality factor (Q-factor) than the conventional on-wafer inductor. Alternatively, the method can fabricate a base comprising a single layer structure or a multilayer structure to improve design capability.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a base having a device-attach surface;
   a radio-frequency (RF) device embedded in the base, adjacent to the device-attach surface;
   a semiconductor device mounted on the RF device at the device-attach surface via a first conductive structure, wherein
   the RF device has a top surface below or aligned to the device-attach surface of the base, and the first conductive structure is in direct contact with the top surface of the RF device.

2. The semiconductor package of claim 1, wherein the first conductive structure is configured to electrically connect the RF device to the semiconductor device.

3. The semiconductor package of claim 1, wherein the RF device has a width larger than 5 μm, and wherein the RF device has a plurality of device portions, and wherein adjacent device portions separated by a portion of the base have a minimum spacing which is about 10-12 μm.

4. The semiconductor package of claim 1, wherein the RF device is an antenna.

5. The semiconductor package of claim 1, further comprising an insulation layer having an opening disposed on the device-attach surface of the base, above the top surface of the RF device, wherein portions of the RF device are exposed within the opening.

6. The semiconductor package of claim 1, further comprising a first conductive trace embedded in the base, adjacent to the device-attach surface, wherein the first conductive trace has a top surface coplanar with the top surface of the RF device.

7. The semiconductor package of claim 6, wherein the first conductive trace has a bottom surface coplanar with a bottom surface of the RF device.

8. The semiconductor package of claim 6, wherein the RF device and the first conductive trace comprise copper.

9. The semiconductor package of claim 6, wherein the semiconductor device is mounted on the first conductive trace via a second conductive structure.

10. The semiconductor package of claim 9, wherein the base comprises a solder-ball-attach surface opposite to the device-attach surface, and the semiconductor package further comprises:
a second conductive trace disposed on the solder-ball-attach surface of the base and a solder-ball structure disposed on the second conductive trace.

11. The semiconductor package of claim 1, wherein the semiconductor device comprises a die, a package, or a wafer-level package.

12. The semiconductor package of claim 9, wherein the second conductive structure comprises a copper bump or solder bump structure.

13. The semiconductor package of claim 1, wherein the base comprises a multiple-layer structure.

14. The semiconductor package of claim 10, wherein the base consists of a single insulative material between the first conductive trace and the second conductive trace.

15. A semiconductor package, comprising:
a base having a device-attach surface;
a radio-frequency (RF) device embedded in the base, adjacent to the device-attach surface;
a semiconductor device mounted on the RF device at the device-attach surface via a first conductive structure, wherein
the RF device has a top surface below or aligned to the device-attach surface of the base, and the first conductive structure is in direct contact with the top surface of the RF device; and
a first conductive trace embedded in the base, adjacent to the device-attach surface, wherein the first conductive trace has a top surface coplanar with the top surface of the RF device.

16. The semiconductor package of claim 15, wherein the first conductive structure is configured to electrically connect the RF device to the semiconductor device.

17. The semiconductor package of claim 15, wherein the RF device has a width larger than 5 µm, and wherein the RF device has a plurality of device portions, and wherein adjacent device portions separated by a portion of the base have a minimum spacing which is about 10-12 µm.

18. The semiconductor package of claim 15, wherein the RF device is an antenna.

19. The semiconductor package of claim 15, further comprising an insulation layer having an opening disposed on the device-attach surface of the base, above the top surface of the RF device, wherein portions of the RF device is exposed within the opening.

20. A semiconductor package, comprising:
a base having a device-attach surface;
a radio-frequency (RF) device embedded in the base, adjacent to the device-attach surface;
a semiconductor device mounted on the RF device at the device-attach surface via a first conductive structure, wherein circuitry of the semiconductor device is disposed on the device-attach surface, wherein
the RF device has a top surface below or aligned to the device-attach surface of the base, and the first conductive structure is in direct contact with the top surface of the RF device; and
a first conductive trace embedded in the base, adjacent to the device-attach surface, wherein the first conductive trace has a top surface coplanar with the top surface of the RF device.

* * * * *